(12) United States Patent
Laur et al.

(10) Patent No.: US 11,480,987 B2
(45) Date of Patent: *Oct. 25, 2022

(54) DIGITALLY PROGRAMMABLE, FULLY DIFFERENTIAL ERROR AMPLIFIER

(71) Applicant: Alpha and Omega Semiconductor (Cayman) Ltd., Grand Cayman (KY)

(72) Inventors: Steven P. Laur, Raleigh, NC (US); Rhys Philbrick, Los Gatos, CA (US); Nicholas Archibald, San Francisco, CA (US)

(73) Assignee: Alpha and Omega Semiconductor (Cayman) Ltd., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 17/384,745

(22) Filed: Jul. 24, 2021

(65) Prior Publication Data

US 2021/0349488 A1 Nov. 11, 2021

Related U.S. Application Data

(63) Continuation of application No. 16/819,834, filed on Mar. 16, 2020, now Pat. No. 11,099,589.

(51) Int. Cl.
*G05F 1/575* (2006.01)
*H03F 3/45* (2006.01)
*G05F 1/565* (2006.01)

(52) U.S. Cl.
CPC .............. *G05F 1/575* (2013.01); *G05F 1/565* (2013.01); *H03F 3/45475* (2013.01)

(58) Field of Classification Search
None
See application file for complete search history.

(56) References Cited

U.S. PATENT DOCUMENTS

| | | | | |
|---|---|---|---|---|
| 5,142,177 A | * | 8/1992 | Higuchi | F16C 27/00 310/90.5 |
| 6,469,483 B2 | | 10/2002 | Katayama | |
| 6,590,366 B1 | * | 7/2003 | Browning | F16C 32/0451 310/90.5 |
| 6,961,637 B2 | * | 11/2005 | Scherer | G05B 19/4163 700/32 |
| 7,456,621 B2 | | 11/2008 | Leung et al. | |
| 9,401,640 B2 | | 7/2016 | Karisson et al. | |
| 9,680,379 B2 | * | 6/2017 | Katikaneni | H02M 3/158 |
| 10,958,169 B2 | | 3/2021 | Arbetter | |
| 11,099,589 B1 | * | 8/2021 | Laur | H03F 3/45475 |

(Continued)

*Primary Examiner* — Thomas J. Hiltunen

(57) ABSTRACT

An error amplifier circuit receives first and second input signals and provides an error amplifier output signal indicative of the difference between the first and second input signals. The error amplifier circuit implements a proportional-integrator-differentiator (PID) circuit having a differential input signal path and including a proportional amplifier circuit, an integrator amplifier circuit, and a differentiator amplifier circuit. The differentiator amplifier circuit receives an AC coupled input signal. The error amplifier circuit sums the output from the proportional amplifier circuit, the integrator amplifier circuit and the differentiator amplifier circuit to provide the error amplifier output signal where the error amplifier output signal is referenced to a first bias voltage.

17 Claims, 9 Drawing Sheets

(56) References Cited

U.S. PATENT DOCUMENTS

2010/0054835 A1* 3/2010 Hayashi .................. B41J 15/08
400/76
2012/0044292 A1* 2/2012 Helsel ..................... B41J 29/38
347/14

* cited by examiner

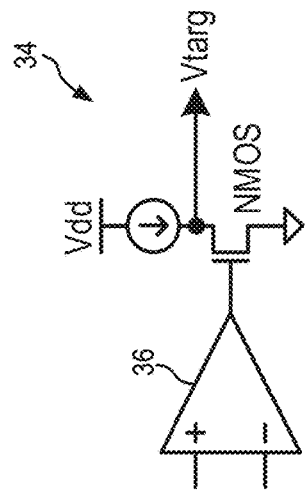
Fig. 4(a)
Class-A output stage
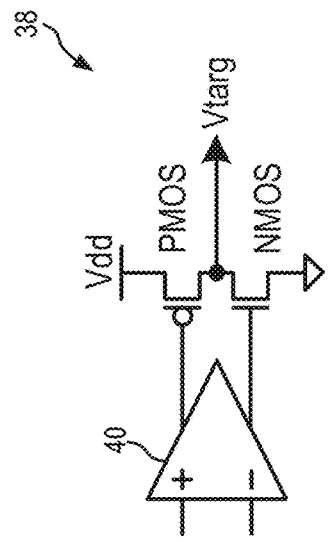
Fig. 4(b)
Class-AB output stage
Fig. 4 (Prior Art)
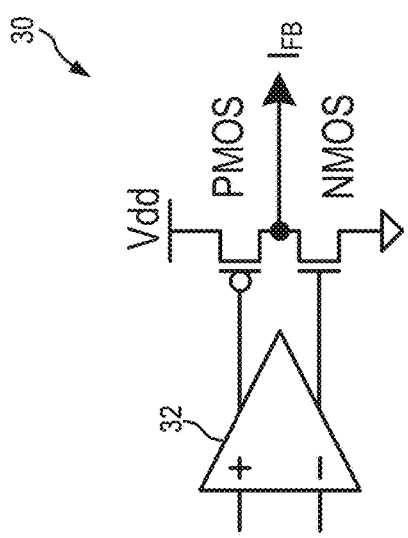
Single-ended CSA output stage
Fig. 3 (Prior Art)

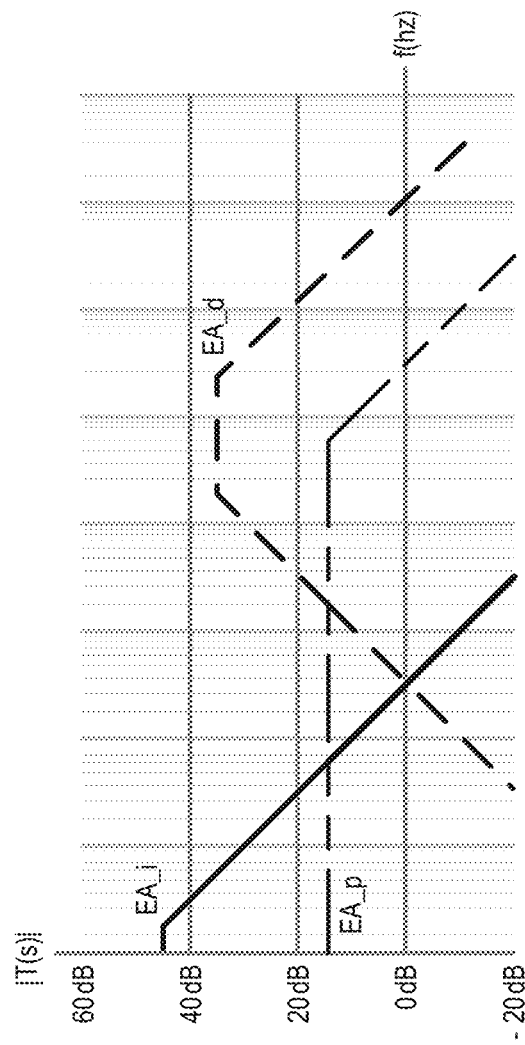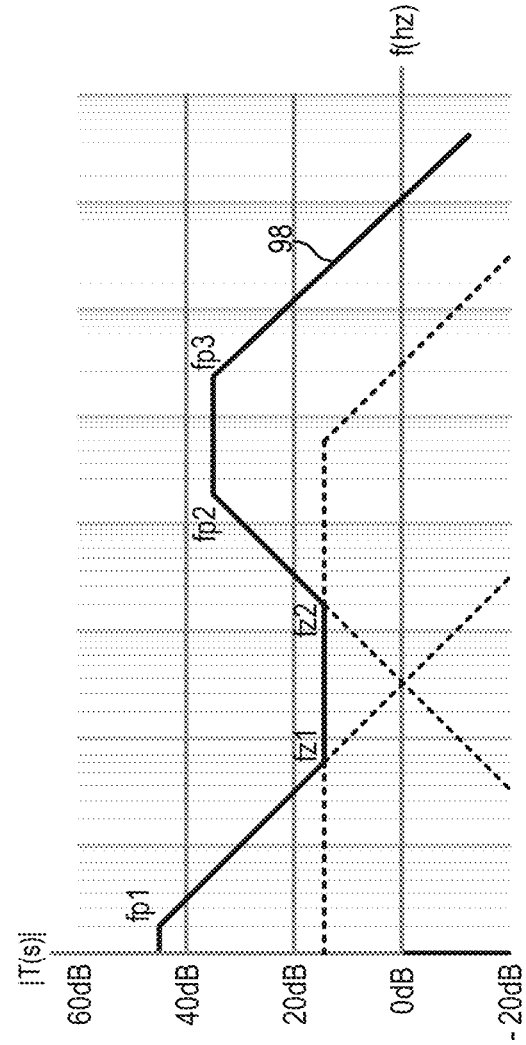
Fig. 8(a)
Fig. 8(b)
Fig. 8

DIGITALLY PROGRAMMABLE, FULLY DIFFERENTIAL ERROR AMPLIFIER

CROSS REFERENCE TO OTHER APPLICATIONS

This application is a continuation of U.S. patent application Ser. No. 16/819,834, entitled DIGITALLY PROGRAMMABLE, FULLY DIFFERENTIAL ERROR AMPLIFIER, filed Mar. 16, 2020, now U.S. Pat. No. 11,099,589, issued Aug. 24, 2021, which is incorporated herein by reference for all purposes.

FIELD OF THE INVENTION

The invention relates to an error amplifier circuit and method and, in particular, to a fully differential error amplifier.

BACKGROUND OF THE INVENTION

Electronic systems, such as laptop computers, typically include power management integrated circuits for regulating the power usage of the electronic systems. Furthermore, electronic systems incorporating integrated circuits typically employ voltage regulators to convert a main bus voltage from a power source supplying the system to one or more voltages necessary for driving the integrated circuits therein. For example, a 5 volts supply voltage provided to an electronic system may need to be reduced to 1.8 volts to drive an integrated circuit in the electronic system. Embedded systems, such as Internet of Things (IoT) devices, include processors (or microcontrollers) and local memory coupled to components and executing embedded software to perform certain tasks. In practice, the processor power supply is provided by a voltage regulator converting an input voltage from a power source to a voltage value specified for the processor.

Switch mode power supplies or switching regulators, also referred to as DC to DC converters, are a type of voltage regulators often used to convert an input supply voltage to a desired output voltage at a voltage level selected for an integrated circuit. In one example, a 12V or 5V supply voltage may be reduced to 1V for supplying an embedded processor. A switching regulator provides power supply function through low loss components such as capacitors, inductors, and transformers, and power switches that are turned on and off to transfer energy from the input to the output in discrete packets. A feedback control circuit is used to regulate the energy transfer to maintain a constant output voltage within the desired load limits of the circuit.

Some switching regulators employ pulse width modulation (PWM) to control the duty cycle of the power switches. That is, the on-time of power switches may be controlled at a given fixed or variable frequency by adjusting the pulse width. Switching regulators employing PWM control include a PWM controller or modulator to drive a power block including the power switches, the driver circuit for the power switches and the LC filter circuit. In some cases, the switching regulator is a single phase converter and the PWM controller generates a single phase PWM clock signal to drive a single phase power block. In other cases, the switching regulator is a multi-phase converter and a multi-phase PWM controller generates clock signals with different phase shifts to drive a multi-phase power block, each clock signal driving a respective power block cell. Multi-phase PWM controllers are desirable when the voltage regulator has to deliver a regulated output voltage with high precision over a wide range of load conditions.

All switch mode power supplies require an amplifier to compare the output voltage or current to a target reference. Any difference, that is, the error, between the output voltage and the target reference is used to correct the output voltage to the desired target reference value. The error amplifier forms the basis of the control loop in the switch mode power supply. The error-amplifier requires specific frequency domain tuning using poles and zeroes to compensate the control loop. Compensation is commonly achieved by a discrete passive resistor and capacitor network wrapped around the amplifier in a variety of ways. Some compensation is integrated on silicon and digitally programmed to reduce external component count and the need for soldering.

BRIEF DESCRIPTION OF THE DRAWINGS

Various embodiments of the invention are disclosed in the following detailed description and the accompanying drawings.

FIG. 3 is a circuit diagram illustrating a single-ended current sense amplifier output stage in some examples.

FIG. 4, which includes FIGS. 4(a) and 4(b), illustrates examples of Class-A and Class-AB output stages which can be incorporated into a summation amplifier in some examples.

FIG. 8, which includes FIGS. 8(a) and 8(b), illustrates the frequency response of the compensation control loop of the error amplifier circuit of FIG. 7 in some embodiments.

DETAILED DESCRIPTION

According to embodiments of the present invention, an error amplifier circuit receives first and second input signals and provides an error amplifier output signal indicative of the difference between the first and second input signals. The error amplifier circuit implements a proportional-integrator-differentiator (PID) circuit having a differential input signal path and including a proportional amplifier circuit, an integrator amplifier circuit, and a differentiator amplifier circuit. The differentiator amplifier circuit receives an AC coupled input signal. The error amplifier circuit sums the output from the proportional amplifier circuit, the integrator amplifier circuit and the differentiator amplifier circuit to provide the error amplifier output signal where the error amplifier output signal is referenced to a first bias voltage.

A salient feature of the error amplifier circuit of the present disclosure is that the error amplifier circuit is implemented with fully differential voltage and/or current architecture to realize matched transfer function from each input to output. The fully differential error amplifier can be implemented with current sense amplifier that does not using any ground referenced NMOS or NPN output stage, which eliminates any low common-mode operating problems. The error amplifier circuit of the present disclosure realizes many advantages over conventional error amplifiers. First, the error amplifier circuit precludes the necessity of a differential-to-single ended summation amplifier for systems that require high accuracy at point of load. Second, the error amplifier circuit thus implemented also eliminates the need for a bi-directional (pull-pull) current sense amplifier in cases where current feedback is desired, as will be discussed in more detail below. Finally, the error amplifier circuit allows for simple loop compensation where each piece part of the compensation bode plot is separate and programmable orthogonally to the others, making loop compensation easier to implement.

Figure 1:
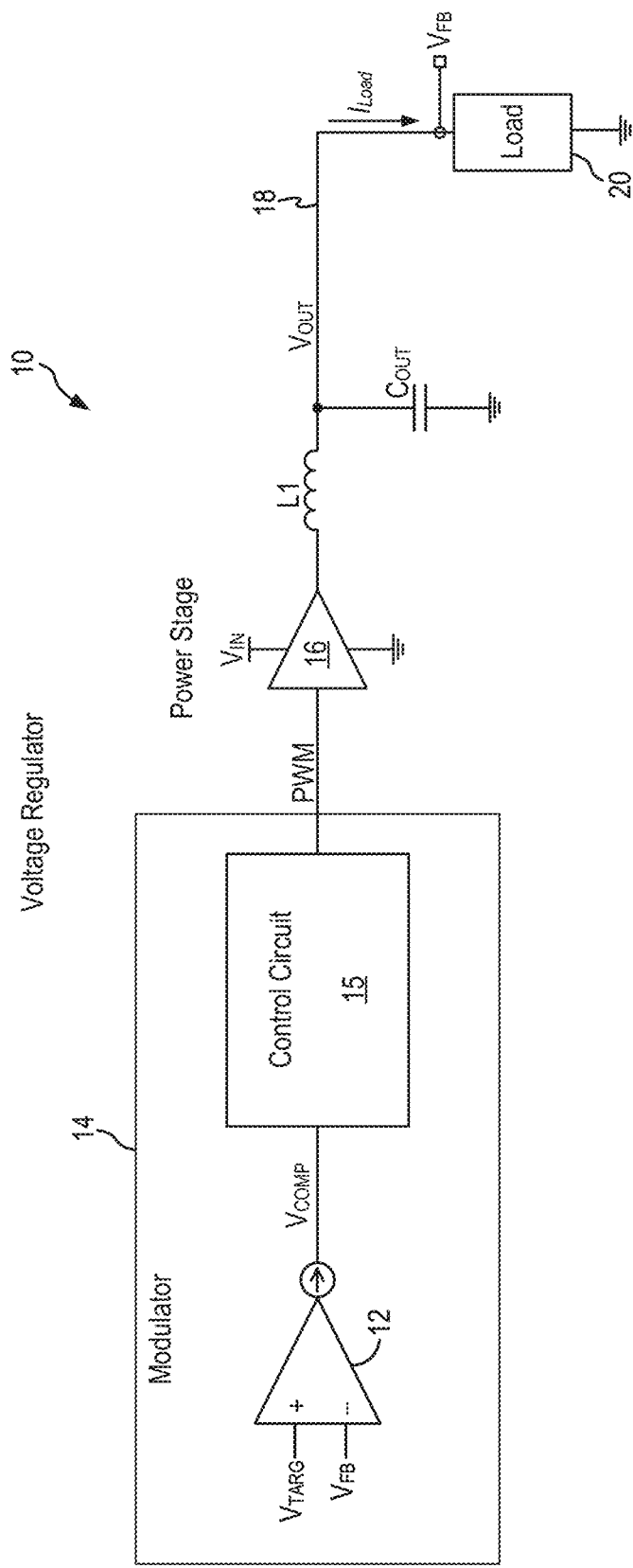
FIG. 1 is a schematic diagram of a voltage regulator in some examples.

FIG. 1 is a schematic diagram of a voltage regulator in some examples. In particular, the voltage regulator of FIG. 1 employs pulse width modulation (PWM) to control the duty cycle of the power switches. That is, the on-time of power switches may be controlled at a given fixed or variable frequency by adjusting the pulse width. Voltage regulators employing PWM control include a PWM controller or PWM modulator to drive a power block including the power switches, the driver circuit for the power switches and the LC filter circuit. In the example shown in FIG. 1, the voltage regulator is a single phase converter and includes a single-phase PWM modulator which generates a single phase PWM clock signal to drive a single phase power block. In other examples, the voltage regulator may be implemented as a multi-phase converter and includes a multi-phase PWM modulator which generates clock signals with different phase shifts to drive a multi-phase power block, each clock signal driving a respective power block cell. The error amplifier circuit of the present disclosure can be incorporated in single-phase converters or multi-phase converters to implement the feedback control loop. The use of a single-phase modulator is illustrative only and not intended to be limiting. The specific configuration of the voltage regulator is not critical to the implementation of the error amplifier circuit of the present disclosure.

Referring to FIG. 1, a voltage regulator 10 includes a single-phase modulator 14 coupled to drive a power block including a power stage 16 with associated output inductor L1 and an output capacitor $C_{OUT}$. More specifically, the voltage regulator 10 receives an input voltage VIN on an input node 17 and generates a regulated output voltage $V_{OUT}$ on an output node 18 to supply a load 20. The modulator 14 provides a PWM signal to drive the power stage 16. The power stage 16 includes a pair of power switches connected in series which are turned on and off by the PWM signal to regulate the output voltage $V_{OUT}$ with reference to a target voltage. In particular, the power switches in the power stage 16 are alternately turned on and off to generate a switching output voltage at a switching output node. The output inductor L1 is coupled to the switching output node of the power stage 16 and the output capacitor $C_{OUT}$. The output inductor L1 and the output capacitor $C_{OUT}$ form an LC circuit for providing current to the output node 18 while maintaining a substantially constant output voltage $V_{OUT}$. The output voltage $V_{OUT}$ can then be used to drive the load 20.

The voltage regulator 10 implements a feedback control loop to regulate the output voltage $V_{OUT}$. To that end, the modulator 14 receives a feedback voltage $V_{FB}$ indicative of the regulated output voltage $V_{OUT}$ either at the output node 18 or at the load 20. In some examples, the feedback voltage $V_{FB}$ is a stepped down voltage of the output voltage $V_{OUT}$. The modulator 14 also receives a target voltage $V_{TARG}$ indicative of the voltage value desired for the regulated output voltage. In some examples, the target voltage may be indicated by a voltage identification code signaling the desired regulator output voltage. For instance, when applied in mobile voltage positioning, the modulator 14 may receive a voltage identification (VID) code that tells the modulator what output voltage it should provide. Each VID code is associated with a voltage value. A decoder decodes the code to generate the target voltage.

The modulator 14 includes circuitry to implement the feedback control loop of the voltage regulator to generate the PWM signal to drive the power stages 16. In particular, the modulator 14 includes an error amplifier 12 coupled to compare the feedback voltage $V_{FB}$ to the target voltage $V_{TARG}$ to generate a control loop error signal $V_{COMP}$. The error signal $V_{COMP}$ can be a voltage signal or a current signal. For example, the error amplifier 12 generates an output current which can be converted to a voltage signal by a loop filter coupled to the output of the error amplifier 12. The error signal $V_{COMP}$ is provided to control circuitry 15, which may include at least a modulating comparator and a latch circuit to generate the PWM signal.

Figure 2:
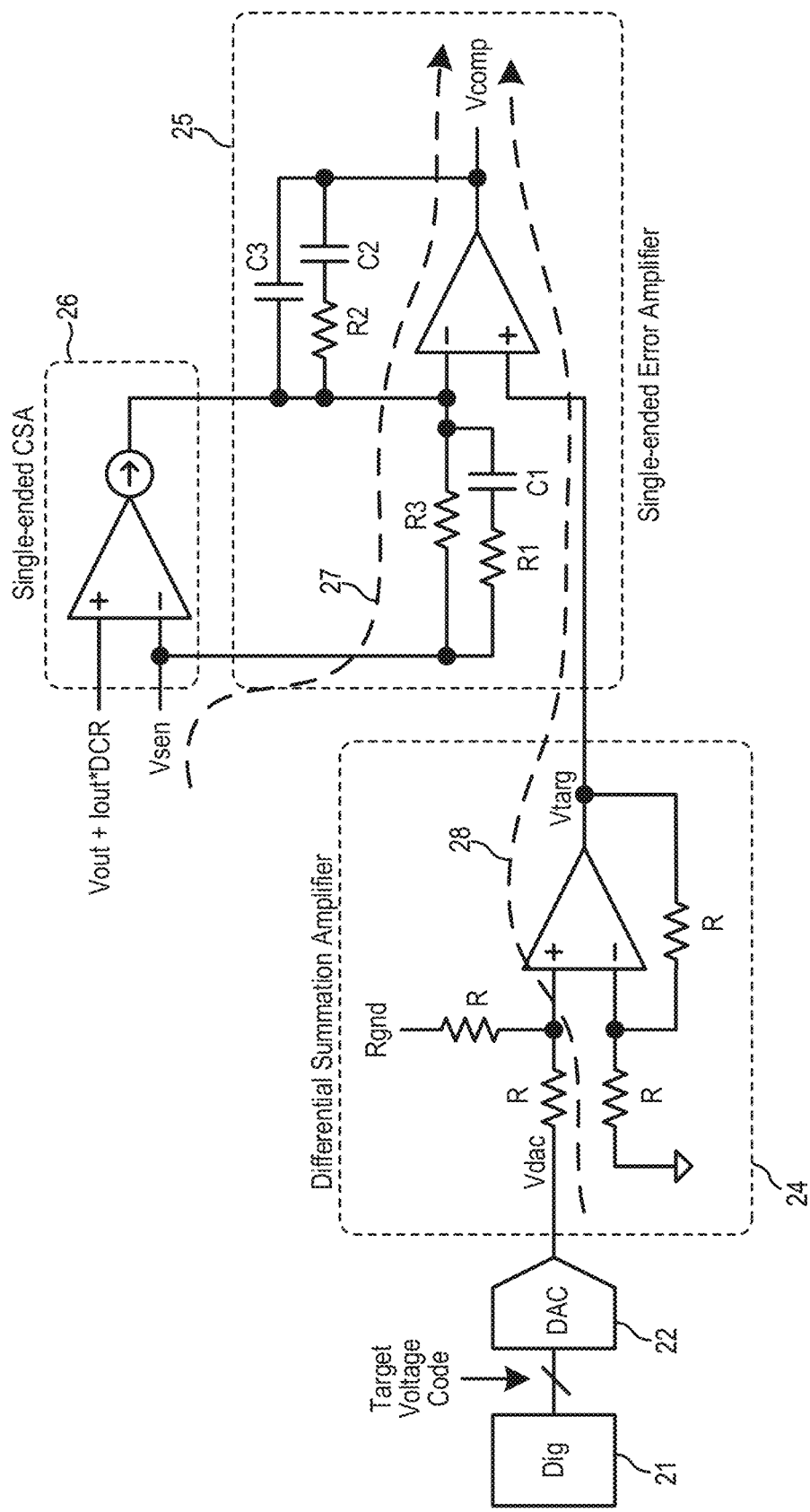
FIG. 2 is a circuit diagram of a single-ended error amplifier with compensation network in some examples.

Conventional error amplifiers used in voltage regulators to implement the feedback control loops are often single-ended systems. Typically, single-ended error amplifier and associated compensation networks are all single-ended. Single-ended systems have different transfer functions through its feedback paths resulting in poor dynamic behavior under certain conditions. FIG. 2 is a circuit diagram of a single-ended error amplifier with compensation network in some examples. Referring to FIG. 2, the single-ended error amplifier 25 receives single-ended input signals—the sense voltage Vsen and the target voltage Vtarg—and provides a single-ended output $V_{COMP}$.

In the present example, the target voltage Vtarg is indicated by a digital target voltage code provided by a digital control circuit 21 signaling the desired regulator output voltage. The target voltage code is converted to an analog voltage signal Vdac using a digital-to-analog converter (DAC) 22. The voltage signal Vdac is summed with the ground potential Rgnd using a differential summation amplifier 24 to generate the target voltage Vtarg, as will be explained in more details below. More specifically, at the error amplifier 25, the inverting input terminal receiving the sense voltage Vsen needs to sum the sense voltage Vsen and the feedback current from the single-ended current sense amplifier (CSA) 26. Meanwhile the non-inverting input terminal of the error amplifier 25 receiving the target voltage Vtarg needs to sum the signal Vdac and the ground potential Rgnd.

In the present description, the sense voltage Vsen refers to a feedback voltage measured at the load. In particular, the voltage regulator, providing a regulated output voltage $V_{OUT}$, is typically positioned away from the load (for example, a CPU) to which it provides power. A feedback voltage is provided from the load (CPU) back to the voltage regulator. This feedback voltage is referred to as the sense voltage Vsen in the present description. For high precision systems, the feedback voltage is a differential signal, including the sense voltage and the ground voltage at the measurement point, i.e. at the load. That is, the sense voltage Vsen is measured at the load (CPU). The ground potential Rgnd at the load is also fed back because the ground at the load (e.g. the CPU's PC board) may be different from the ground potential at the voltage regulator. In some cases, there may be a few millivolt difference between the ground potential at the load and the ground potential at the voltage regulator. In cases where high precision voltage regulation is needed, the target voltage Vtarg needs to be adjusted based on the ground potential at the load. That is, the target voltage Vtarg is given as: Vtarg=Vdac+Rgnd. For example, if Vdac is 1V, and Rgnd is 0.01V, then the Vtarg is 1.01V. Accordingly, in the conventional configuration, the differential summation amplifier 24 is used to sum the ground potential Rgnd with the signal Vdac to obtain the target voltage Vtarg for the error amplifier 25.

The circuit configuration for the error amplifier 25 results in two signal paths each having a different transfer function. In particular, the feedback signal path (line 27) for the sense voltage Vsen has a different transfer function from the reference signal path (line 28) for the target voltage Vtarg. The different transfer functions between the two signal paths create undesirable output response during dynamic operation and can result in poor frequency response for the output signal $V_{COMP}$. Furthermore, when additional amplifier, such as the differential summation amplifier 24, is required to combine differential feedback signals, the amplifier often has to work to ground potential, which is difficult and may require a negative rail, which is not available on computing systems. In ideal operation, if inputs to the error amplifier are balanced, that is, the two inputs are the same and there is no error, the output signal $V_{COMP}$ should be at a given voltage (not zero). This condition can be satisfied at the error amplifier 25. But this condition cannot be achieved at the differential summation amplifier 24. At the differential summation amplifier 24, if the signal Vdac is at ground or near ground, then the circuit needs to drive the target voltage Vtarg to ground which is difficult to do.

In the conventional error amplifier, when current feedback is desired, the single-ended current sense amplifier 26 is used to provide a current feedback. The current sense amplifier 26 compares the voltage sensed at the load (Vsen) and output voltage at the voltage regulator (Vout+Iout*DCR). The current sense amplifier 26 provides a single-ended feedback current output. FIG. 3 is a circuit diagram illustrating a single-ended current sense amplifier output stage in some examples. Referring to FIG. 3, the current sense amplifier 26 typically includes a single-ended output stage. The single-ended output stage is typically a "push-pull" or Class-AB output stage utilizing both PMOS and NMOS transistors. In practice, PMOS and NMOS transistors work poorly when biased in triode mode (i.e. out of saturation).

When the error amplifier is a single-ended voltage feedback amplifier. Additional differential amplifier, such as the differential summation amplifier 24 (FIG. 2), is needed for systems that need differential remote sense for accuracy (e.g., for sensing Intel CPU loads). The differential summation amplifier requires additional silicon area and increase the current flow. In some cases, the differential summation amplifier experiences gain or accuracy loss at low common mode output. FIG. 4, which includes FIGS. 4(a) and 4(b), illustrates examples of Class-A and Class-AB output stages which can be incorporated into a summation amplifier in some examples. Referring to FIG. 4, the summation amplifier 24 converts differential feedback to a single-ended output signal. The output stage of the summation amplifier can be a Class-A output stage (FIG. 4(a)) or a Class-AB output stage (FIG. 4(b)). In general amplifiers work well if MOS devices are in saturation. If MOS devices are biased in triode region, the gain varies widely and the operation can be unstable. The single-ended amplifiers have bad accuracy when the output voltage is near ground or at ground (e.g. Vtarg is 0V for standby voltage).

Figure 5:
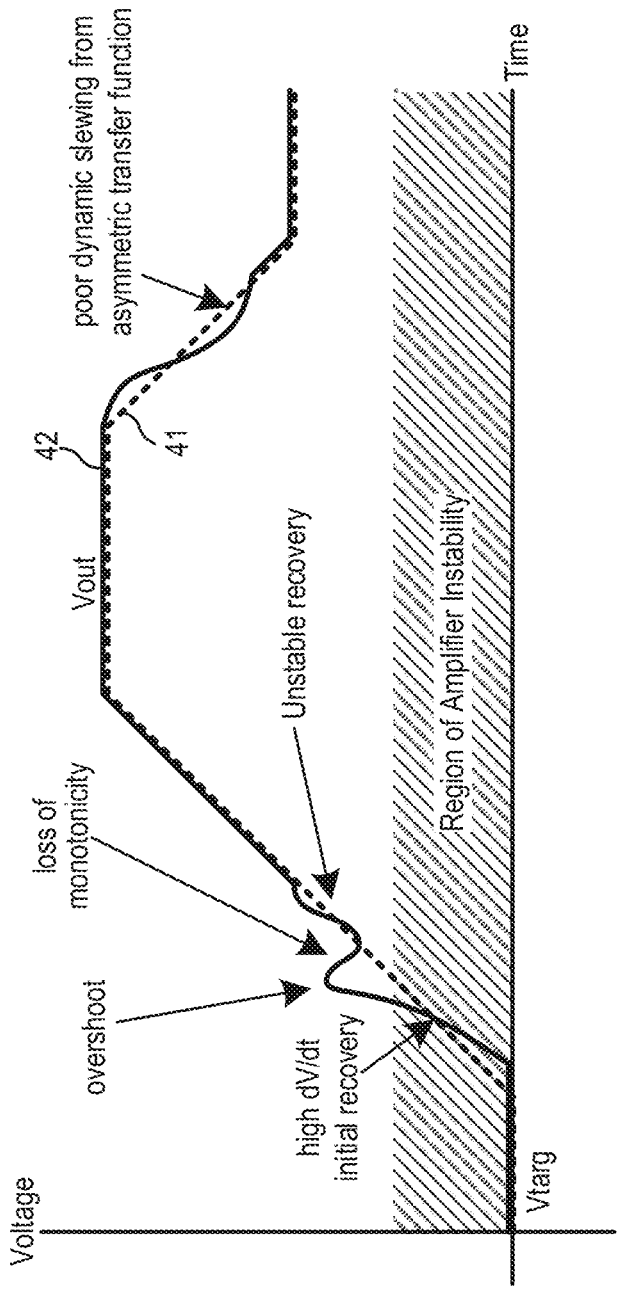
FIG. 5 is a plot illustrating the undesired output voltage behavior in a voltage regulator due to the use of the single-ended error amplifier in some examples.

FIG. 5 is a plot illustrating the undesired output voltage behavior in a voltage regulator due to the use of the single-ended error amplifier in some examples. Referring to FIG. 5, the target voltage Vtarg (curve 41) is represented by the dotted line and the output voltage Vout (curve 42) is represented by the solid line. The target voltage Vtarg starts from an initial state of 0V and increases to a given desired output voltage value over time and then decreases to another desired output voltage value later one.

Because the feedback signal path and the reference signal path at the error amplifier have asymmetric frequency response. The result is that the voltage regulator has poor regulation at low target voltages. Thus, at low values of the target voltage Vtarg, the error amplifier is unstable and the output voltage is not well regulated. Furthermore, the poor frequency response causes the output voltage Vout to not be able to follow the target voltage Vtarg. As shown in FIG. 5, the output voltage Vout has periods of out of regulation and unstable recovery. The output voltage can have excessive dV/dt during initial loop recovery and can significantly overshoot the target voltage. The asymmetric frequency response also results in poor dynamic slewing and the output voltage can be non-monotonic. All of these behavior is undesirable for the voltage regulator.

In embodiments of the present disclosure, an error amplifier circuit is implemented using a full differential input signal path. The error amplifier circuit of the present disclosure overcomes many of the shortcoming of the conventional single-ended error amplifier circuits and provides for a more robust overall solution when incorporated into a voltage regulator. In some embodiments, the error amplifier circuit of the present disclosure can cooperate with current sense amplifier using only PMOS transistors in the output stage. The error amplifier circuit of the present disclosure provides high precision per unit area. The error amplifier circuit of the present disclosure enables natural mixing of the remote ground potential with the target voltage and does not require a differential summation amplifier to sum the remote ground potential with the target voltage. Furthermore, the error amplifier circuit of the present disclosure has inputs that can work to the ground potential to realize full error amplifier operation while providing a safe common mode output voltage away from the ground potential. In particular, the error amplifier can be biased to a common bias voltage (e.g. 2V) which ensures that the amplifier does not have any output common mode problems. In some embodiments, the error amplifier circuit is implemented using operational transconductance amplifier circuits which simplifies the overall design and loop compensation. For instance, clamping of the operational transconductance amplifiers is significantly easier than voltage-mode operational amplifiers.

Figure 6:
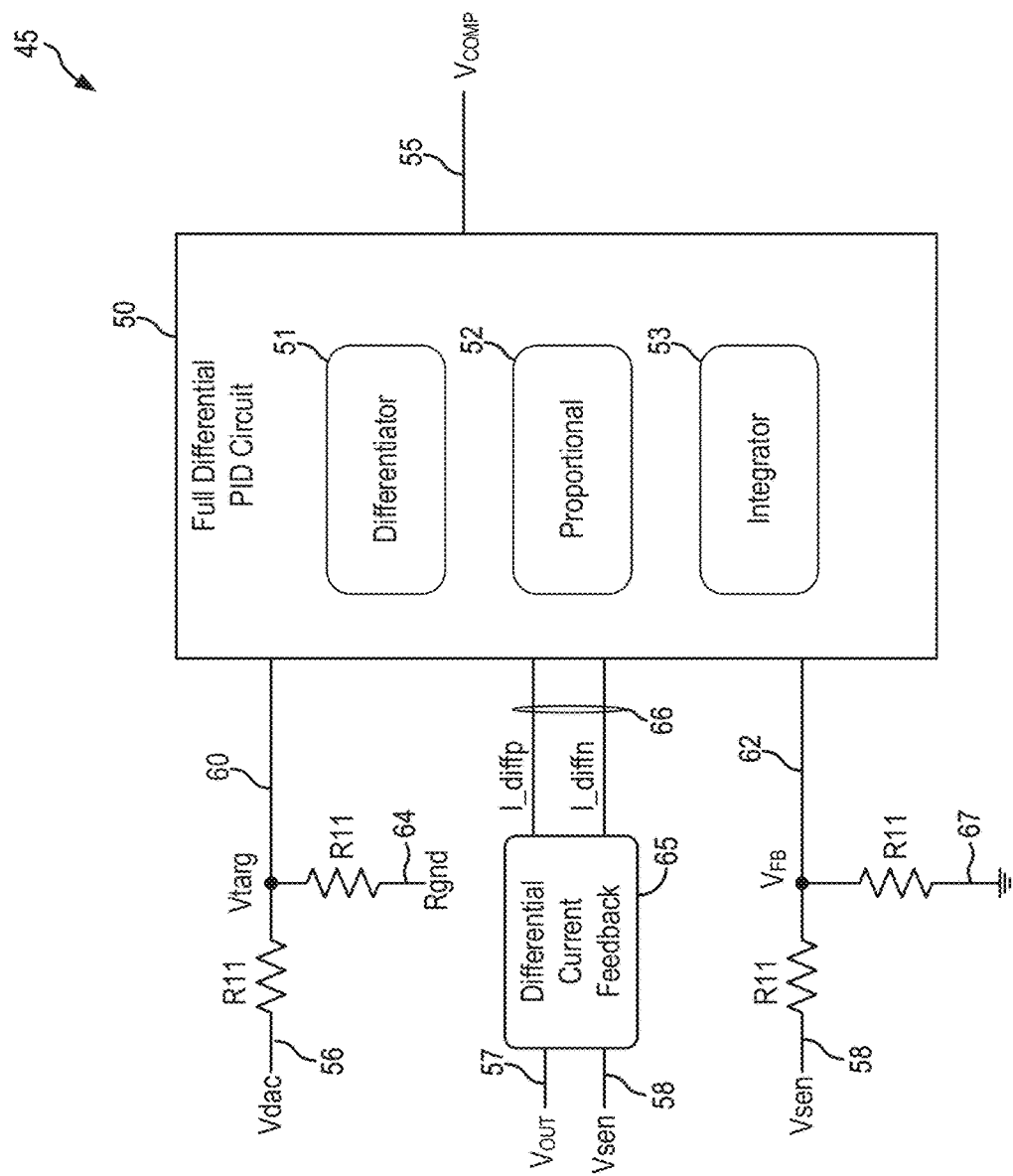
FIG. 6 is a circuit diagram illustrating a full differential error amplifier circuit in embodiments of the present disclosure.

FIG. 6 is a circuit diagram illustrating a full differential error amplifier circuit in embodiments of the present disclosure. Referring to FIG. 6, a full differential error amplifier circuit 45 is provided to compare a feedback voltage to a target voltage and to generate an error amplifier output signal indicative of the difference between the feedback voltage and the target voltage. In embodiments of the present disclosure, the feedback voltage measures a voltage of interest in an electronic system and the target voltage indicates the desired voltage level for the voltage of interest.

For example, the voltage of interest may be the regulated output voltage ($V_{OUT}$) generated by a voltage regulator and being applied to drive a load (e.g. a CPU). The feedback voltage is indicative of a sense voltage which measures the regulated output voltage at the load. The target voltage indicates the desired voltage level for the regulated output voltage. In some embodiments, the target voltage is generated from an analog voltage signal derived from a digital target voltage code.

In embodiments of the present disclosure, the error amplifier circuit 45 is implemented as a proportional-integrator-differentiator (PID) circuit 50 having a full differential input signal path. The PID circuit 50 includes a proportional amplifier circuit 52, an integrator amplifier circuit 53, and a differentiator amplifier circuit 51. The signal Vdac (node 56), indicative of the target voltage code, is provided to a voltage divider formed by resistors R11 and biased to the remote ground potential Rgnd (node 64) to generate the target voltage Vtarg (node 60). Accordingly, the target voltage Vtarg (node 60) is referenced to the remote ground potential Rgnd (node 64). The sense voltage Vsen (node 58), indicative of a feedback voltage of the voltage of interest measured at the load, is provided to a voltage divider formed by resistors R11 and biased to the local ground potential (node 67) to generate the feedback voltage $V_{FB}$ (node 62). The target voltage Vtarg and the feedback voltage $V_{FB}$ are provided to the PID circuit 50. The PID circuit 50 of the error amplifier circuit 45 sums the output from the proportional amplifier circuit 52, the integrator amplifier circuit 53 and the differentiator amplifier circuit 51 to provide the error amplifier output signal $V_{COMP}$ (node 55). In embodiments of the present disclosure, the error amplifier output signal $V_{COMP}$ is referenced to a first bias voltage having a positive voltage value greater than 0V. In this manner, the output common mode of the error amplifier circuit is safely biased away from the ground potential. In embodiments of the present disclosure, the differentiator amplifier circuit 51 receives the sense voltage signal Vsen through AC coupling, as will be explained in more detail below.

In some embodiments, the error amplifier circuit 45 includes a differential current feedback circuit 65. The differential current feedback circuit 65 compares the voltage of interest (node 57) (e.g. the output voltage $V_{OUT}$ of a voltage regulator) to the sense voltage Vsen (node 58) being the feedback voltage of the voltage of interest measured at the load. The differential current feedback circuit 65 provides differential currents I_diffp and I_diffn (66) as output signals. The differential currents I_diffp and I_diffn are provided to the full differential PID circuit 50. The differential current feedback circuit 65 is optional and may be included when current feedback is desired. In some embodiments, the differential current feedback circuit 65 may be omitted.

Figure 7:
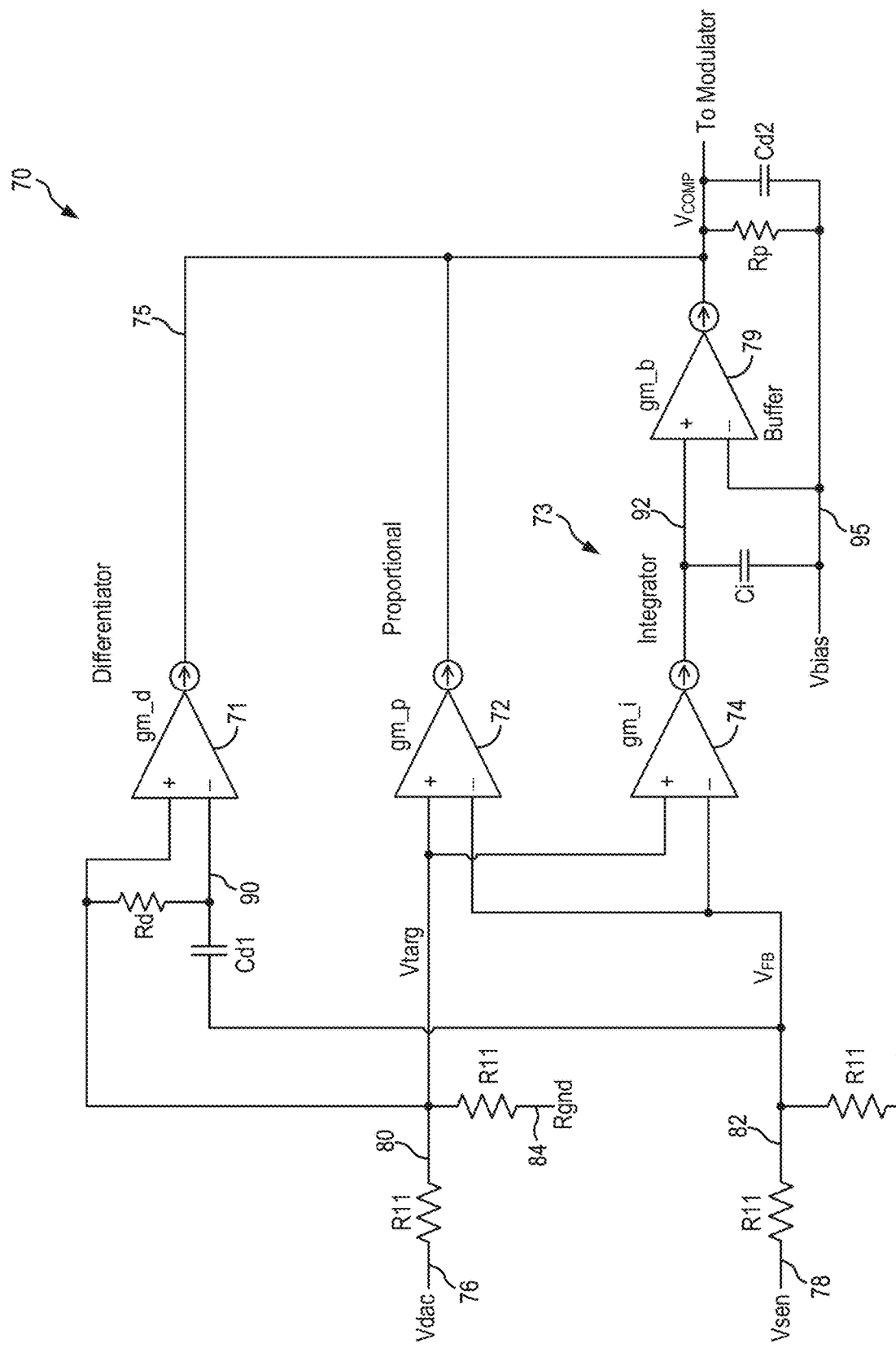
FIG. 7 is a circuit diagram illustrating a full differential error amplifier circuit in embodiments of the present disclosure.

FIG. 7 is a circuit diagram illustrating a full differential error amplifier circuit in embodiments of the present disclosure. Referring to FIG. 7, a full differential error amplifier circuit 70 includes a first voltage divider formed by resistors R11 for receiving the voltage signal Vdac (node 76) and to generate the target voltage Vtarg (node (80 referenced to the remote ground potential Rgnd (node 84). The error amplifier circuit 70 further includes a second voltage divider formed by resistors R11 for receiving the sense voltage signal Vsen (node 78) and to generate the target feedback $V_{FB}$ (node (82) referenced to a local ground potential (node 87). In some examples, the sense voltage is indicative of a feedback voltage of the voltage of interest measured at the load and the voltage signal Vdac indicates a desired voltage level for the voltage of interest. The first and second voltage dividers form a differential voltage divider. As described above, the remote ground potential Rgnd is the ground potential at the load.

The error amplifier circuit 70 includes a proportional amplifier circuit 72 formed by an operational transconductance amplifier (OTA) having a gain of gm_p. The proportional amplifier circuit 72 has a non-inverting input terminal coupled to receive the target voltage Vtarg and an inverting input terminal coupled to receive the feedback voltage $V_{FB}$. The proportional amplifier circuit 72 provides an output current signal on node 75 indicative of the difference between the target voltage Vtarg and the feedback voltage $V_{FB}$.

The error amplifier circuit 70 includes an integrator amplifier circuit 73 formed by an integrator amplifier 74 and a buffer 79. The integrator amplifier 74 is an operational transconductance amplifier (OTA) having a gain of gm_i. The integrator amplifier 74 receives the same input signals as the proportional amplifier circuit 72. In particular, the integrator amplifier 74 has a non-inverting input terminal coupled to receive the target voltage Vtarg and an inverting input terminal coupled to receive the feedback voltage $V_{FB}$. The integrator amplifier 74 provides an output current signal on node 92 indicative of the difference between the target voltage Vtarg and the feedback voltage $V_{FB}$. The output current signal on node 92 is integrated by a capacitor Ci coupled between node 92 and a bias voltage node 95 which is biased to a bias voltage Vbias. The integrated signal on node 92 is coupled to the non-inverting input terminal of the buffer 79. The inverting input terminal of the buffer 79 is coupled to the bias voltage node 95. The buffer 79 provides an output current signal on node 75 indicative of the difference between the integrated signal (node 92) and the bias voltage Vbias (node 95).

The error amplifier circuit 70 includes a differentiator amplifier circuit 71 formed by an operational transconductance amplifier (OTA) having a gain of gm_d. The differentiator amplifier circuit 71 has a non-inverting input terminal coupled to receive the target voltage Vtarg and an inverting input terminal coupled to receive the feedback voltage $V_{FB}$ through AC coupling. In particular, the feedback voltage $V_{FB}$ is coupled to a first plate of a capacitor Cd1. The second plate of the capacitor Cd1 (node 90) is coupled to the inverting input terminal of the differentiator amplifier circuit 71. A resistor Rd is coupled between the non-inverting and inverting input terminals (nodes 80 and 90). The differentiator amplifier circuit 71 provides an output current signal on node 75 indicative of the difference between the target voltage Vtarg and the AC-coupled feedback voltage $V_{FB}$. In operation, the differentiator amplifier circuit 71 receives the AC coupled sense voltage signal Vsen. Therefore, the differentiator amplifier circuit 71 provides no signal at DC and provides output signal at high frequency. That is, when the sense voltage Vsen is changing rapidly, the differentiator amplifier circuit 71 will respond to provide an output signal.

The output current signals from the proportional amplifier circuit 72, the integrator amplifier circuit 73 and the differentiator amplifier circuit 71 are summed at node 75. A resistor Rp and a capacitor Cd2 are connected in parallel between the summing node 75 and the bias voltage node 95. As a result, the summed current signal is converted to a voltage signal being the error amplifier output signal $V_{COMP}$. In particular, the error amplifier output signal $V_{COMP}$ is referenced to the bias voltage Vbias. In some embodiments, the bias voltage Vbias is a positive voltage greater than 0V. In embodiments of the present disclosure, the error amplifier output signal $V_{COMP}$ is referenced to the bias voltage Vbias so as to keep devices being driven by the signal $V_{COMP}$ well biased in saturation even when the error measured by the error amplifier output is zero. For example, when the feedback voltage $V_{FB}$ is equal to the target voltage Vtarg, then there is no current output from the PID circuit because there is no error. In that case, the error amplifier output voltage $V_{COMP}$ is kept at the bias voltage Vbias so that all the transistors being driven by the error amplifier output signal are well-biased in saturation.

In embodiments of the present disclosure, the voltage dividers have the same resistance value, denoted by resistor R11. In this manner, the feedback signal path (Vsen) and the reference signal path (Vdac) have the same resistance values so that the two signal paths are well matched. In the present embodiment, the voltage dividers are formed using resistors R11 of the same resistance value. In other embodiment, the voltage dividers can be formed using a resistor R11 in series with a resistor R12, resistors R11 and R12 having different resistance values. In that case, both voltage dividers will be formed using resistors R11 and R12 in order to ensure matching signal paths.

In embodiments of the present disclosure, the error amplifier circuit 70 can be implemented using conventional operational transconductance amplifier architecture and standard matching techniques. The differential voltage divider can leverage process matching to realize highly matched resistance values. Finally, the error amplifier circuit architecture is largely process agnostic and the circuit performance does not vary widely over process variations.

FIG. 8, which includes FIGS. 8(a) and 8(b), illustrates the frequency response of the compensation control loop of the error amplifier circuit of FIG. 7 in some embodiments. In particular, FIG. 8 illustrates type-III compensation tuning that can be implemented as a result of the circuit arrangement of the error amplifier circuit of FIG. 7. Referring to FIG. 8, the output currents from the proportional-integrator-differentiator amplifier circuit are summed such that the low-pass filter (Integrator), the flat gain (Proportional) and high-pass filter (Differentiator) (FIG. 8(a)) create the type-III compensation frequency response outlined in FIG. 8(b).

More specifically, the integrator amplifier circuit provides a low-pass filter frequency response EA_i, the proportional amplifier circuit provides a flat gain frequency response EA_p, and the differentiator amplifier circuit provides a high-pass filter frequency response EA_d. When the output currents are summed together, the frequency response (curve 98) in FIG. 8(b) results. The frequency response (curve 98) of the error amplifier output signal has 3 poles (fp1, fp2 and fp3) and 2 zeros (fz1 and fz2).

In some embodiments, the locations of the poles and the zeros in the frequency response are as follows:

$f_{p1}=1/(2\pi \cdot ro \cdot Ci)$;

$f_{z1}=gm\_i/(2\ \pi \cdot gm\_p \cdot Ci)$ $f_{z2}=gm\_p/(2\ \pi \cdot Rd \cdot Cd \cdot \sqrt{(gm\_d^2-gm\_p^2)})$*

$f_{p2}=1/(2\ \pi \cdot Rd \cdot Cd1)$ $f_{p3}=1/(2\ \pi \cdot Rp \cdot Cd2)$

The mid-band gain is gm_p·Rp and the high frequency gain is gm_d·Rp.

As thus constructed, the error amplifier circuit of the present disclosure has a frequency response between the sense voltage Vsen and the target voltage Vtarg that is well balanced so that the voltage of interest (e.g. the regulated output voltage $V_{OUT}$ of a voltage regulator) can follow the target voltage.

Figures 9, 9A:
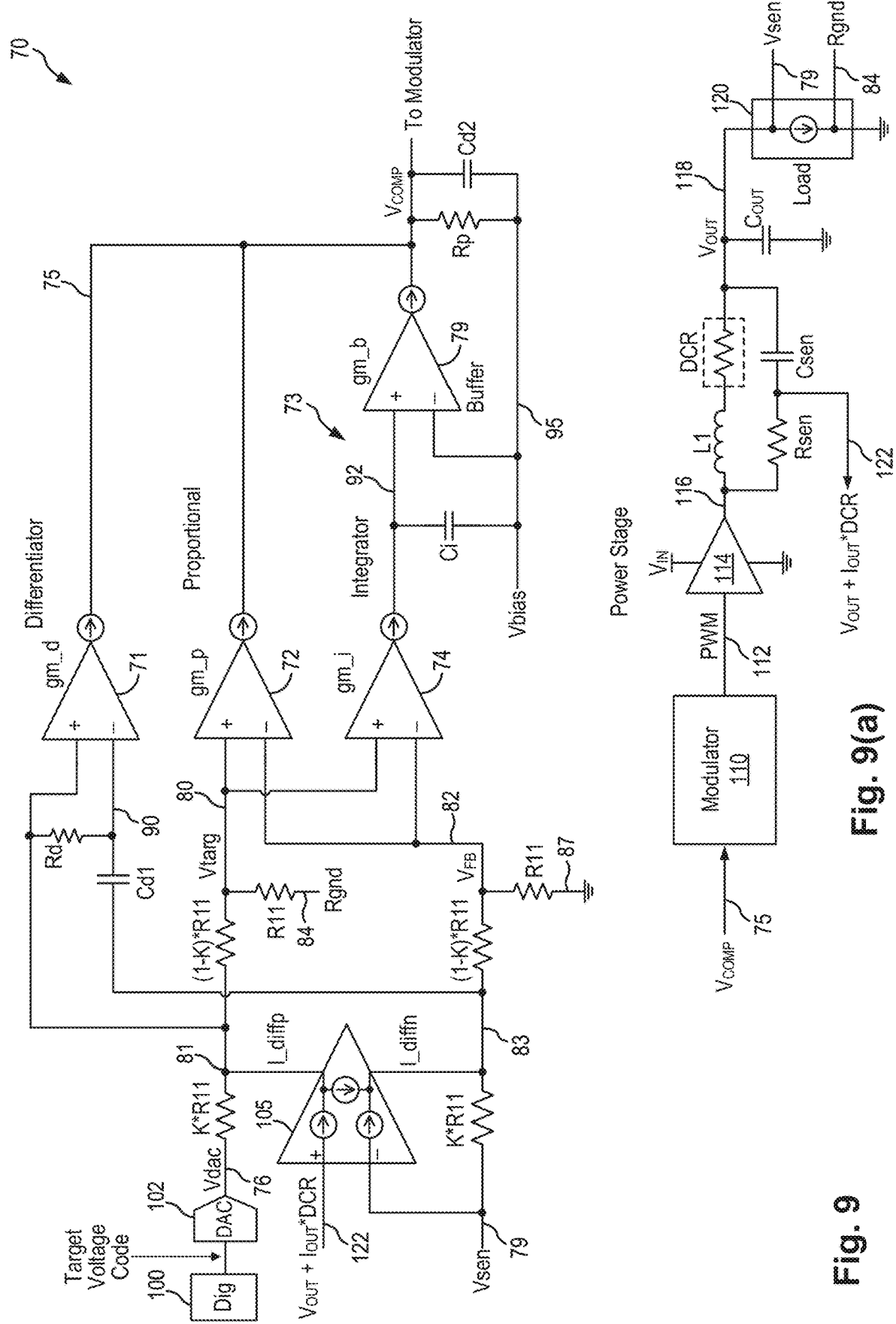
FIG. 9, which includes
FIG. 9(a), is a circuit diagram illustrating a full differential error amplifier circuit in alternate embodiments of the present disclosure.

FIG. 9, which includes FIG. 9(a), is a circuit diagram illustrating a full differential error amplifier circuit in alternate embodiments of the present disclosure. FIG. 9 illustrates an extension of the error amplifier circuit of FIG. 7. Like elements in FIGS. 7 and 9 are given like reference numerals to simplify the discussion. Referring to FIG. 9, the error amplifier circuit 70 is constructed in the same manner as shown in FIG. 7 and includes a proportional amplifier circuit 72, an integrator amplifier circuit 73 and a differentiator amplifier circuit 71. The signal Vdac is generated from a digital target voltage code provided by a digital circuit 100. The digital target voltage code is provided to a digital to analog converter (DAC) 102 to be converted to the signal Vdac (node 76).

In the present embodiment, the error amplifier circuit 70 is implemented to include differential current feedback. To that end, a differential current sense amplifier 105 is used to compare a signal indicative of the voltage of interest (non-inverting input terminal 122) and the sense voltage Vsen measuring the voltage of interest at the load (inverting input terminal 79). The differential current sense amplifier 105 provides differential currents I_diffp and I_diffn as output signals. In some embodiments, the differential currents I_diffp and I_diffn are coupled to the target voltage node 80 and the feedback voltage node 82, respectively. In the present embodiment, the first resistor R11 of the differential voltage dividers are split and the differential feedback currents are provided to the part of the resistance value of the resistor R11.

In particular, the first voltage divider between node 76 (Vdac) and node 84 (Rgnd) includes a first resistor R11 connected between node 76 (Vdac) and node 80 (Vtarg). The first resistor R11 is split into two resistors K*R11 and (1−K)*R11 connected in series, where K is a number between 0 and 1, so that the total resistance of the two resistors is the same as first resistor R11. Meanwhile, the second voltage divider between node 79 (Vsen) and node 87 (ground) includes a second resistor R11 connected between node 79 (Vsen) and node 82 ($V_{FB}$). The second resistor R11 is split into two resistors K*R11 and (1−K)*R11 connected in series, where K is a number between 0 and 1, so that the total resistance of the two resistors is the same as second resistor R11.

In embodiments of the present disclosure, the differential currents I_diffp and I_diffn are injected into the split resistors. That is, the differential current I_diffp is coupled to node 81 between resistors K*R11 and (1−K)*R11 in the first voltage divider and the differential current I_diffn is coupled to node 83 between resistors K*R11 and (1−K)*R11 in the second voltage divider. In other words, the current sense amplifier 105 sinks the differential current I_diffp into the signal Vdac and sources the differential current I_diffn out of sense voltage Vsen. Furthermore, while the proportional amplifier circuit 72 and the integrator amplifier circuit 73 receive the target voltage Vtarg (node 80) and the feedback voltage $V_{FB}$ (node 82), the differentiator amplifier circuit 71 receives input signals from the split resistors. That is, the differentiator amplifier circuit 71 has the non-inverting input terminal coupled to node 81 between the split resistors K*R11 and (1−K)*R11 in the first voltage divider. The differentiator amplifier circuit 71 further has the inverting input terminal coupled through capacitor Cd1 to node 83 between the split resistors K*R11 and (1−K)*R11 in the second voltage divider. In this manner, differential current feedback is provided to the error amplifier circuit 70. The current feedback provided to the signal Vdac of the error amplifier circuit compensates for offset in the circuit.

In the embodiment shown in FIG. 9, the error amplifier circuit 70 is applied in the feedback control loop of a voltage regulator generating a regulated output voltage $V_{OUT}$. An example embodiment of a voltage regulator circuit is shown in FIG. 9(a).

Referring to FIG. 9(a), the voltage regulator is configured to receive an input voltage VIN and generate a regulated output voltage $V_{OUT}$. The error amplifier output signal $V_{COMP}$ (node 75) is coupled to a modulator 110 which generates the PWM signal (node 112) for driving a power stage 114 including a pair of power switches. The power stage 114 is coupled between the input voltage VIN and the ground potential. The power stage 114 generates a switching output voltage (node 116) which is coupled to and output filter circuit formed by inductor L1 and output capacitor $C_{OUT}$. The regulated output voltage $V_{OUT}$ provided at output node 118 which is coupled to drive a load 120. The load 120 may be positioned remotely from the voltage regulator.

In the present embodiment, the current flowing through the inductor L1 is measured through the DC resistance (DCR) of the inductor L1. Note that resistor DCR is the parasitic resistance of the inductor L1 and is shown inside a dotted box to indicate that the resistor is not an actual resistor. A sense resistor Rsen and a capacitor Csen are connected in series across the inductor L1. A signal at node 122 between the sense resistor Rsen and the capacitor Csen is indicative of the regulated output voltage $V_{OUT}$ and the output current $I_{OUT}$ as measured across the DC resistance of the inductor L1. That is, the signal $V_{out}+I_{OUT}*DCR$ is provided at node 122 which is coupled to the non-inverting input terminal of the differential current sense amplifier 105. Meanwhile, the sense voltage Vsen is measured at the node and the sense voltage Vsen (node 79) as well as the remote ground potential Rgnd (node 84) at the load are fed back to the error amplifier 70. The sense voltage Vsen (node 79) is coupled to the second voltage divider and also to the inverting input terminal of the differential current sense amplifier 105. The remote ground potential Rgnd (node 84) is provided to the first voltage divider to generate the target voltage Vtarg referenced to the remote ground potential Rgnd.

As thus configured, the error amplifier circuit 70 incorporates current feedback in the PID circuit to provide an error amplifier output signal with increased accuracy.

In the embodiment shown in FIG. 9, the resistor R11 is shown as being split into two resistors K*R11 and (1−K)*R11, where K is a number between 0 and 1. In some embodiments, the resistor R11 can be constructed as a potentiometer to provide a tap in the middle of the resistance value for the feedback current to be sunk or sourced. The value K can be varied to adjust the gain of the feedback current provided to the differentiator amplifier circuit 71.

Figure 10:
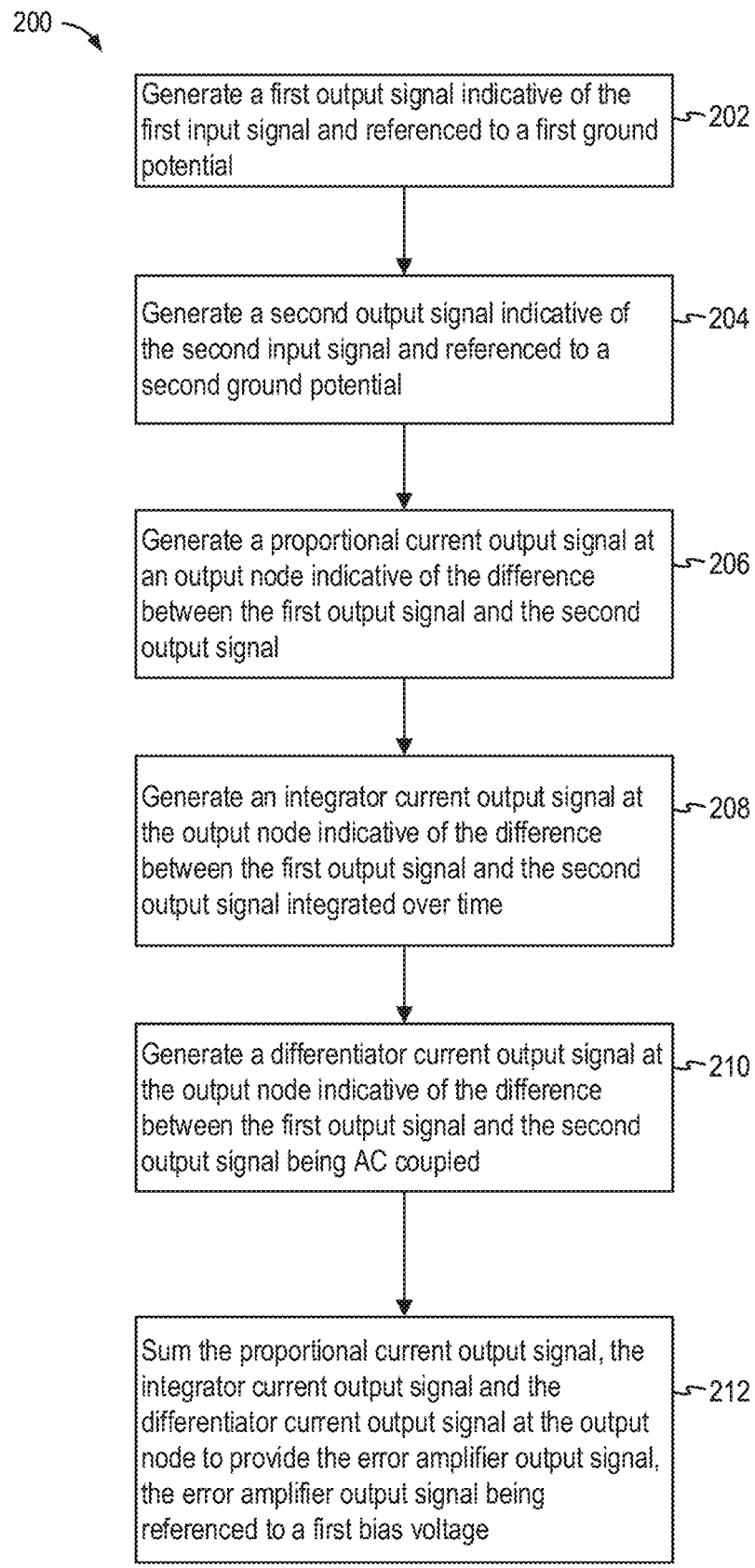
FIG. 10 is a flowchart illustrating a method in an error amplifier in embodiments of the present disclosure.

FIG. 10 is a flowchart illustrating a method in an error amplifier in embodiments of the present disclosure. Referring to FIG. 10, a method 200 in an error amplifier receives first and second input signals and provides an error amplifier output signal indicative of the difference between the first and second input signals. The method 200 starts by generating a first output signal indicative of the first input signal and referenced to a first ground potential (202). The method 200 then generates a second output signal indicative of the second input signal and referenced to a second ground potential (204). The method 200 generates a proportional current output signal at an output node indicative of the difference between the first output signal and the second output signal (206). The method 200 also generates an integrator current output signal at the output node indicative of the difference between the first output signal and the second output signal integrated over time (208). The method 200 further includes generating a differentiator current output signal at the output node indicative of the difference between the first output signal and the second output signal being AC coupled (210). The method 200 sums the proportional current output signal, the integrator current output signal and the differentiator current output signal at the output node to provide the error amplifier output signal, the error amplifier output signal being referenced to a first bias voltage.

The invention can be implemented in numerous ways, including as a process; an apparatus; a system; a composition of matter; a computer program product embodied on a computer readable storage medium; and/or a processor, such as a hardware processor or a processor device configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. An error amplifier circuit for receiving first and second input signals and providing an error amplifier output signal indicative of the difference between the first and second input signals, the error amplifier circuit comprising:
 a proportional-integrator-differentiator (PID) circuit having a differential input signal path to receive a first signal and a second signal, the first signal being related to the first input signal and the second signal being related to the second input signal, the first signal being referenced to a first ground potential and the second signal being referenced to a second ground potential different from the first ground potential, the PID circuit including a proportional amplifier circuit and an integrator amplifier circuit each receiving the first and second signals as respective input signals, and a differentiator amplifier circuit receiving the first signal and receiving the second signal through AC coupling as respective input signals, the proportional amplifier circuit, the integrator amplifier circuit and the differentiator amplifier circuit having output terminals that are connected together to an error amplifier output node to provide the error amplifier output signal, the error amplifier output signal being referenced to a first bias voltage.

2. The error amplifier circuit of claim 1, further comprising:
a first voltage divider coupled between the first input signal and the first ground potential, a first output node of the first voltage divider providing the first signal related to the first input signal and referenced to the first ground potential; and
a second voltage divider coupled between the second input signal and the second ground potential, a second output node of the second voltage divider providing the second signal related to the second input signal and referenced to the second ground potential.

3. The error amplifier circuit of claim 1, wherein the first input signal comprises a reference signal indicative of a desired voltage level for a regulated output voltage coupled to drive a load, and the first signal comprises a reference voltage related to the reference signal and referenced to the first ground potential; and wherein the second input signal comprises a sense voltage indicative of the regulated output voltage at the load, the sense voltage being referenced to the first ground potential, and the second signal comprises a feedback voltage indicative of the sense voltage and referenced to the second ground potential.

4. The error amplifier circuit of claim 3, wherein the error amplifier output signal is indicative of the difference between the reference voltage and the feedback voltage.

5. The error amplifier circuit of claim 1, wherein the proportional amplifier circuit comprises:
a first transconductance amplifier having a non-inverting input terminal coupled to receive the first signal and an inverting input terminal coupled to receive the second signal, the first transconductance amplifier having an output terminal providing a first output current signal proportional to a difference between the first signal and the second signal, the output terminal being coupled to the error amplifier output node; and
a first resistor coupled between the output terminal of the first transconductance amplifier and the first bias voltage.

6. The error amplifier circuit of claim 5, wherein the integrator amplifier circuit comprises:
a second transconductance amplifier having a non-inverting input terminal coupled to receive the first signal and an inverting input terminal coupled to receive the second signal, the second transconductance amplifier having an output terminal providing a second output current signal proportional to a difference between the first signal and the second signal;
a first capacitor has a first terminal coupled to the output terminal of the second transconductance amplifier and a second terminal coupled to the first bias voltage, the first capacitor integrating the second output current signal; and
a third transconductance amplifier having a non-inverting input terminal coupled to the first terminal of the first capacitor and an inverting input terminal coupled to the first bias voltage, the third transconductance amplifier having an output terminal providing a third output current signal proportional to a difference between a voltage on the first capacitor and the first bias voltage, the output terminal being coupled to the error amplifier output node.

7. The error amplifier circuit of claim 6, wherein the differentiator amplifier circuit comprises:
a second capacitor having a first terminal coupled to receive the second signal and a second terminal;
a fourth transconductance amplifier having a non-inverting input terminal coupled to receive the first signal and an inverting input terminal coupled to the second terminal of the second capacitor to receive an AC coupled second signal, a second resistor coupled between non-inverting input terminal and the inverting input terminal of the fourth transconductance amplifier, the fourth transconductance amplifier having an output terminal providing a fourth output current signal proportional to a difference between the first signal and the AC coupled second signal, the output terminal being coupled to the error amplifier output node; and
a third capacitor coupled between the output terminal of the fourth transconductance amplifier and the first bias voltage,
wherein the output terminals of the first, third and fourth transconductance amplifier are coupled to the error amplifier output node to provide the error amplifier output signal being referenced to the first bias voltage.

8. The error amplifier circuit of claim 2, wherein the first voltage divider comprises a third resistor and a fourth resistor connected in series between the first input voltage and the first ground potential, the first output node providing the first signal being between the third and the fourth resistors; and the second voltage divider comprises a fifth resistor and a sixth resistor connected in series between the second input voltage and the second ground potential, the second output node providing the second signal being between the fifth and the sixth resistors, wherein the third and fifth resistors have the same resistance, and the fourth and sixth resistors have the same resistance.

9. The error amplifier circuit of claim 2, wherein the first input signal comprises a reference signal indicative of a desired voltage level for a regulated output voltage coupled to drive a load, and the first signal comprises a reference voltage related to the reference signal and referenced to the first ground potential; and wherein the second input signal comprises a sense voltage indicative of the regulated output voltage at the load, the sense voltage being referenced to the first ground potential, and the second signal comprises a feedback voltage indicative of the sense voltage and referenced to the second ground potential.

10. The error amplifier circuit of claim 9, further comprising:
a current sense amplifier having an non-inverting input terminal coupled to receive a third input signal indicative of the regulated output voltage and an inverting input terminal coupled to receive the second input signal comprising the sense voltage indicative of the regulated output voltage at the load, the current sense amplifier providing a pair of differential output currents on a pair of differential output terminals indicative of a difference between the third input signal and the second input signal, the pair of differential output currents comprising a first differential output current coupled to the output node of the first voltage divider, and a second differential output current coupled to the output node of the second voltage divider.

11. The error amplifier circuit of claim 10, wherein the first voltage divider comprises a third resistor and a fourth resistor connected in series between the first input voltage and the first ground potential, the first output node providing the first signal being between the third and the fourth resistors; and the second voltage divider comprises a fifth resistor and a sixth resistor connected in series between the second input voltage and the second ground potential, the second output node providing the second signal being between the fifth and the sixth resistors.

12. The error amplifier circuit of claim 11, wherein the third resistor comprises a seventh resistor and an eighth resistor connected in series between the first input signal and the first output node, and the fifth resistor comprises a ninth resistor and a tenth resistor connected in series between the second input signal and the second output node, the first differential output current being coupled to a node between the seventh and eighth resistors and the second differential output current being coupled to a node between the ninth and tenth resistors.

13. The error amplifier circuit of claim 12, wherein the differentiator amplifier circuit receives the first signal at the node between the seventh and eighth resistors and receives the second signal through AC coupling at the node between the ninth and tenth resistors.

14. The error amplifier circuit of claim 12, wherein the third and fifth resistors have the same resistance value, and the seventh resistor and the ninth resistor have the same resistance value.

15. The error amplifier circuit of claim 7, wherein the first, second, third and fourth transconductance amplifiers each comprises an operational transconductance amplifier.

16. The error amplifier circuit of claim 1, wherein the first bias voltage has a positive voltage value greater than 0V.

17. The error amplifier circuit of claim 3, wherein the first ground potential comprises a ground potential at the load and the second ground potential comprises a ground potential at the error amplifier circuit.

* * * * *